(12) United States Patent
Fujita et al.

(10) Patent No.: US 6,222,391 B1
(45) Date of Patent: *Apr. 24, 2001

(54) SEMICONDUCTOR INTEGRATED CIRCUIT

(75) Inventors: Tetsuya Fujita, Kawasaki; Tadahiro Kuroda, Yokohama, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/864,033

(22) Filed: May 27, 1997

(30) Foreign Application Priority Data

May 28, 1996 (JP) ................................... 8-133457

(51) Int. Cl.[7] ................................... H03K 19/20
(52) U.S. Cl. ........................................... 326/126; 326/124
(58) Field of Search ........................... 326/126–127, 326/63, 75, 80, 89, 31, 33

(56) References Cited

U.S. PATENT DOCUMENTS

| | | | |
|---|---|---|---|
| 4,359,653 | * 11/1982 | Takamasa | 326/127 |
| 4,970,417 | * 11/1990 | Kubota | 326/80 |
| 5,045,807 | * 9/1991 | Ishihara et al. | 326/126 |
| 5,072,136 | * 12/1991 | Naghshineh | 326/126 |
| 5,107,145 | * 4/1992 | Kurashima | 326/127 |
| 5,610,539 | * 3/1997 | Blauschild et al. | 326/127 |

FOREIGN PATENT DOCUMENTS 4-88716 * 3/1992 (JP) ................................... 326/126

OTHER PUBLICATIONS

Taub et al. Digital Integrated Electronics. McGraw–Hill, pp. 229–230, 1977.*

* cited by examiner

Primary Examiner—Jon Santamauro
Assistant Examiner—Steven S. Paik
(74) Attorney, Agent, or Firm—Hogan & Hartson, LLP

(57) ABSTRACT

A circuit for shifting the potential level of an input signal toward higher potentials is added to a conventional differential ECL circuit in order to shift levels of emitter potentials of npn bipolar transistors forming a current switch toward higher potentials. Thus, the ECL circuit is improved to ensure a continuous flow of a current and to maintain stable operations even at an instant where base potentials of the npn bipolar transistors are switched by a standard ECL-level signal even when the power source voltage is around −2 V.

9 Claims, 2 Drawing Sheets

SEMICONDUCTOR INTEGRATED CIRCUIT

BACKGROUND OF THE INVENTION

This invention relates to a semiconductor and, more particularly, to an ECL (Emitter Coupled Logic) integrated circuit.

Semiconductor integrated circuits using bipolar transistors for transmitting logic signals are generally classified into TTL circuits, ECL circuits, and others. In TTL circuits, high potential levels range from 2.4 V to 2.5 V, low potential levels range from 0 V to 0.4 V. In ECL circuits, potential levels are −0.7 V to −1.9 V, and amplitudes are around 1 V, which are largely different from those of TTL circuits and require different usages.

FIG. 4 is a circuit diagram of a conventional differential ECL circuit, and FIG. 5 is an explanatory diagram schematically showing potentials at internal nodes in the differential ECL circuit of FIG. 4 when the base-emitter voltage $V_{BE}$ of npn bipolar transistors is 0.9 V and the reference potential GND is 0 V.

Construction of the differential ECL circuit is explained below.

Resistors R1, R2 are supplied at their first ends with the reference potential GND, which is typically the ground potential. Connected to the other ends of the resistors R1 and R2 are collectors of npn bipolar transistors Q1 and Q2. Introduced to bases of these two npn bipolar transistors Q1, Q2 are input signals IN and /IN (/ denotes inverted signal) of potential levels between −0.9 V and −1.7 V. Commonly connected emitters of the npn bipolar transistors Q1, Q2 are connected to one end of a resistor R3, and the power source potential $V_{EE}$ is applied to the other end of the resistor R3. These elements form a current switch S1, and output from the current switch S1 is used as input to an emitter follower. That is, bases of npn bipolar transistors Q3, Q4 whose collectors are supplied with the reference potential GND are connected to the connection node of a resistor R1 and the collector of the npn bipolar transistor Q1 and the connection node of a resistor R2 and the collector of the npn bipolar transistor Q2. Emitters of the npn bipolar transistors Q3, Q4 are connected to given ends of resistors R4, R5 whose other ends are supplied with the power source potential $V_{EE}$. Output signals OUT and /OUT of the differential ECL circuit are taken out from connection nodes of the npn bipolar transistors Q3, Q4 and given ends of resistors R4, R5. The resistors R1 and R2 have the same resistance value R.

In the conventional differential ECL circuit, input signals IN and /IN of potential levels from −0.9 V to −1.7 V are introduced to the current switch S1. Among two npn bipolar transistors Q1, Q2 forming the current switch S1, one having a higher base voltage is turned ON, and emitter potentials of Q1, Q2 represent values lower by corresponding base-emitter voltages $V_{BE}$ than the higher base potential.

The differential ECL circuit operates as explained below.

One of the resistors R1, R2 connected to one of the npn bipolar transistors Q1, Q2 currently in its ON state permits a current I to flow from a reference voltage point for giving the reference potential GND to one end, and the potential of its other end decreases to $-R^X I$. Further, in the emitter follower, a potential $-R^X I - V_{BE}$ which is lower than the potential $-R^X I$ by the base-emitter voltage $V_{BE}$ of the ON-state npn bipolar transistor Q3 or Q4 is taken out from the output terminal as an output signal OUT or /OUT of a LOW level. On the other hand, the other of the resistors R1, R2 connected to OFF-state one of the npn bipolar transistors Q1, Q2 does not introduce the current from the reference potential point for giving the reference potential GND to one end, and maintains a potential substantially equal to the reference potential GND at the other end. Therefore, in the emitter follower, a potential $GND - V_{BE}$ lower than the reference potential GND by the base-emitter voltage $V_{BE}$ of the ON-state npn bipolar transistor Q3 or Q4 is taken out from the output terminal as an output signal OUT or /OUT of a HIGH level.

As a result, when, for example, the base potential of the npn bipolar transistor Q1 is −0.9 V and the base potential of Q2 is −1.7 V, the npn bipolar transistor Q1 is turned ON, and emitter potentials of Q1, Q2 become $-0.9\ V - V_{BE} = -1.8$ V.

In the above-explained differential ECL circuit, however, when the base potential of the npn bipolar transistor Q1 is switched from −0.9 V to −1.7 V, and the base potential of Q2 from −1.7 V to −0.9, the base potential of Q1 and the base potential of Q2 transitionally becomes equal, and the emitter potentials of Q1 and Q2 decrease to $-1.3\ V - V_{BE} = -2.2$ V, which causes the following problem. If the power source potential $V_{EE}$ is higher than −2.2 V, then no current flows in the current switch S1 for a while, where two outputs OUT and /OUT, which must be differential, both remain in the HIGH level. Therefore, the conventional differential ECL circuit cannot ensure stable operations unless the power source potential $V_{EE}$ is lower than −2.2 V, and therefore needs an additional power source for generating the power source potential $V_{EE}$ in addition to the power source for generating the a terminal voltage $V_{TT}$ (=−2 V).

As reviewed above, there is a difficulty in maintaining stable operations required as a stable logic circuit by applying a typical ECL-level signal to a differential ECL circuit and by using a low voltage power source of approximately −2 V to activate the circuit. Not only for differential ECL circuit, the above discussion essentially applies also to single-end ECL circuits in which only structural difference lies in fixing one of input signals to a predetermined potential (typically, −1.3 V).

SUMMARY OF THE INVENTION

It is therefore an object of the invention to provide a semiconductor integrated circuit, namely an ECL circuit, which can be operated in a stable mode even by a low voltage power source of approximately −2 V.

According to the invention, there is provided a semiconductor integrated circuit comprising an additional circuit for generating a differential input signal of a potential within a predetermined range in response to an input signal; and an ECL circuit to which the differential input signal is introduced. Since the circuit for shifting the potential level of the input signal toward higher potentials is added to a conventional differential ECL circuit so as to shift the levels of emitter potentials of npn bipolar transistors forming a current switch toward higher potentials, an improved ECL circuit can be realized, which can ensure a continuous flow of a current and can maintain stable operations even in an instant where base potentials of the npn bipolar transistors are switched by a standard ECL-level signal even when the power source voltage is around −2 V.

A second aspect of the invention is configured to introduce a second reference potential $V_{REF}$, in lieu of an input signal $V_{IN}'$, to bases of the npn bipolar transistors forming the current switch, but it is essentially based on the same theory as that of the first aspect. Therefore, also the semiconductor integrated circuit according to the second aspect can realize an ECL circuit capable of maintaining stable operations.

DESCRIPTION OF THE PREFERRED EMBODIMENTS

Semiconductor integrated circuits embodying the invention are explained below with reference to the drawings.

Features of semiconductor integrated circuits according to the invention lie in adding to a conventional differential ECL circuit a circuit for shifting the potential level of the input signal toward higher potentials to shift the potential level of emitter potentials of npn bipolar transistors forming a current switch toward higher potentials.

Using this arrangement, an ECL circuit can be realized, which can be continuously supplied with a current even and can maintain stable operations even upon switching of base potentials of the npn bipolar transistors forming the current switch by a standard ECL-level signal, also when the power source voltage is approximately −2 V.

Figure 1:
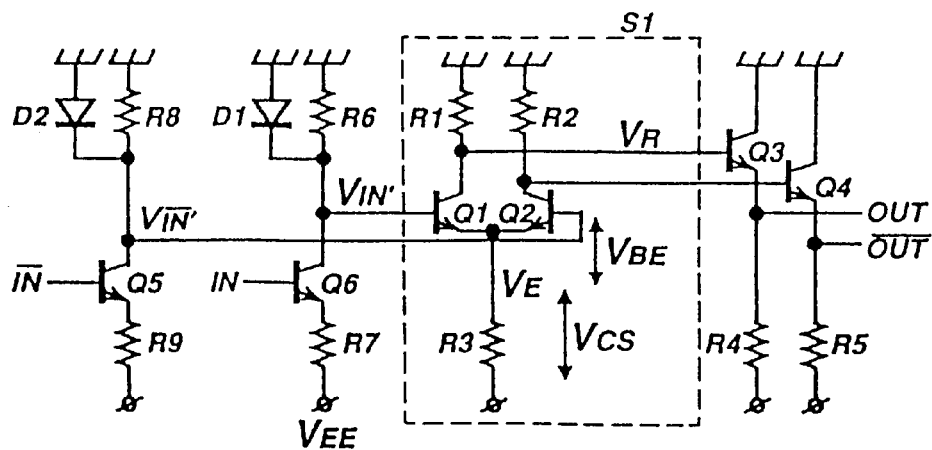
FIG. 1 is a circuit diagram of a semiconductor integrated circuit according to a first embodiment of the invention.
Figure 2:
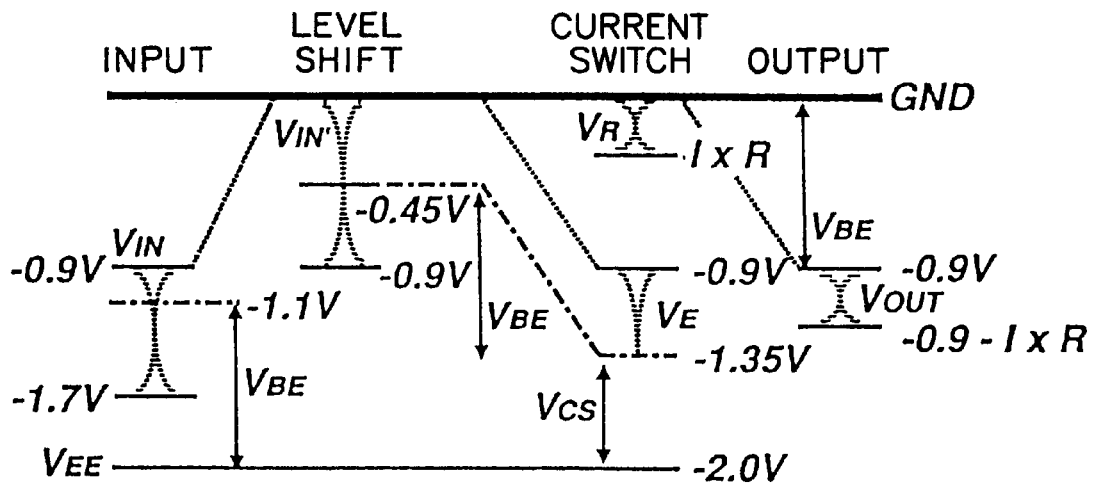
FIG. 2 is an explanatory diagram schematically showing potentials at internal nodes in the semiconductor integrated circuit of FIG. 1 when the base-emitter voltage $V_{BE}$ of npn bipolar transistors is 0.9 V, reference potential GND is 0 V, and power source potential is $V_{EE}$.

FIG. 1 is a circuit diagram of a semiconductor integrated circuit taken as a first embodiment of the invention, and FIG. 2 is an explanatory diagram schematically showing potentials at internal nodes in the semiconductor integrated circuit of FIG. 1 where the base-emitter voltage $V_{BE}$ of npn bipolar transistors is 0.9 V, reference potential GND is 0 V, and power source potential is $V_{EE}$.

The semiconductor integrated circuit according to the first embodiment has the following arrangement.

The semiconductor integrated circuit embodying the invention uses an additional circuit located at an input side of the current switch in the conventional differential ECL circuit to shift the potential level of an input signal introduced to the current switch toward higher potentials. In the additional circuit, a reference potential GND, which is typically the ground potential, is supplied to the anode of a diode D1 and to one end of a resistor R6. The cathode of the diode D1 and the other end of the resistor R6 are commonly connected to the collector of an npn bipolar transistor Q6. The bipolar transistor Q6 is supplied with one of input signals, IN, through the base, and its emitter is connected to one end of a resistor R7. The other end of the resistor R7 is supplied with the power source potential $V_{EE}$. Similarly, the reference potential GND, typically the ground potential, is applied to the anode of a diode D2 and to one end of a resistor R8. The cathode of the diode D2 and the other end of the resistor R8 are commonly connected to the collector of another npn bipolar transistor Q5. The bipolar transistor Q5 is supplied with the other input signal /IN at the base, and its emitter is connected to one end of a resistor R9. The other end of the resistor R9 is supplied with the power source potential $V_{EE}$. The diodes D1, D2 prevent an excessive current from flowing into the resistors R6, R8 to prevent an acceptable decrease in potential at the other ends of the resistors R6, R8.

$V_{IN}'$ for use as one input signal of the differential ECL circuit is taken out from the connection node of the diode D1 and the resistor R6 with the collector of the npn bipolar transistor Q6 in the additional circuit. Similarly, $V_{/IN}'$ for use as the other input signal of the differential ECL circuit is taken out from the connection node of the diode D2 and the resistor R8 with the collector of the npn bipolar transistor Q5.

The part of the differential ECL circuit has the same arrangement as that of the conventional circuit as explained below. The resistors R1, R2 are supplied at their first ends with the reference potential GND, which is typically the ground potential. Connected to the other ends of the resistors R1 and R2 are collectors of npn bipolar transistors Q1 and Q2. Introduced to bases of these two npn bipolar transistors Q1, Q2 are input signals $V_{IN}'$ and $V_{/IN}'$ taken out from the additional circuit. Commonly connected emitters of the npn bipolar transistors Q1, Q2 are connected to one end of the resistor R3, and the power source potential $V_{EE}$ is applied to the other end of the resistor R3. These elements form the current switch S1, and output from the current switch S1 is used as input to the emitter follower. That is, bases of npn bipolar transistors Q3, Q4 whose collectors are supplied with the reference potential GND are connected to the connection node of the resistor R1 with the collector of the npn bipolar transistor Q1 and the connection node of the resistor R2 with the collector of the npn bipolar transistor Q2. Emitters of the npn bipolar transistors Q3, Q4 are connected to given ends of resistors R4, R5 whose other ends are supplied with the power source potential $V_{EE}$. Output signals OUT and /OUT of the differential ECL circuit are taken out from connection nodes of the npn bipolar transistors Q3, Q4 with given ends of the resistors R4, R5. The resistors R1 and R2 have the same resistance value R.

Explained below are behaviors of the semiconductor integrated circuit according to the first embodiment of the invention. This embodiment employs a relatively low power source potential of $V_{EE}=-2$ V.

When the input signal IN having the potential of −0.9 V is applied to the base of the npn bipolar transistor Q6 and the input signal /IN having the potential of −1.7 V to the base of Q5, the base-emitter voltage $V_{BE}$ of the npn bipolar transistor Q6 becomes 0.9 V or more in relation to the power source potential $V_{EE}$. Thus, Q6 is turned ON, and a current flows in the resistor R7. While the current flows into the resistor R7, in the resistor R6 supplied with the reference potential GND at one end, the potential at its other end becomes −0.9 V due to restriction of the forward voltage of the diode D1. A potential signal appearing at the other end of the resistor R6 is introduced as one input signal $V_{IN}'$ to the base of the npn bipolar transistor Q1. On the other hand, since the base-emitter voltage $V_{BE}$ of the npn bipolar transistor Q5 becomes less than 0.9 V in relation with the power source potential $V_{EE}$, Q5 is turned OFF, and no current flows in the resistor R9. Therefore, in the resistor R8 supplied with the reference potential GND at one end, the potential at its other end becomes substantially equal to the reference potential GND. A potential signal appearing at the other end of the resistor R8 is introduced as the other input signal $V_{/IN}'$ to the base of the npn bipolar transistor Q2.

While the base potential of the npn bipolar transistor Q5 changes from −0.9 V to −1.7, and the base potential of Q6 from −1.7 V to −0.9 V, when their base potential values pass through $V_{EE}+V_{BE}=-1.1$ V, approximately, npn bipolar transistors Q5 and Q6 change between ON and OFF. In this process, the potential at the other end of the resistor R6 and the potential at the other end of the resistor R8 cross at the intermediate potential −0.45 V between 0 V and −0.9 V. Although the potential at the other end of the resistor R6 and the potential at the other end of the resistor R8 are introduced to the base of the npn bipolar transistor Q1 and the base of Q2, respectively, emitter potentials of the npn bipolar transistors Q1 Q2 never decrease below $-0.45$ V$-V_{BE}=-1.35$ V, even transitionally, and these potentials are always maintained above −1.35 V. Therefore, even if the power source potential $V_{EE}$ is −2 V, the current flowing in the current switch S1 is never blocked transitionally, and never causes unstable transmission of the logic signal. Since a stable behavior is ensured even when the power source potential $V_{EE}$, a single electric power source can be commonly used as both the electric power source for generating the terminal voltage $V_{TT}$ (=−2 V) and the electric power source for generating the power source voltage $V_{EE}$.

In the semiconductor integrated circuit according to the invention described above, diodes D1, D2 and resistors R6, R8 are used to form the circuit for shifting the potential level of the input signal to the current switch of the ECL circuit toward higher potentials. However, diodes D1, D2 may be omitted from the circuit arrangement in applications with small fluctuations in power source potential $V_{EE}$. In other applications, npn bipolar transistors may be used in lieu of the diodes, so as to for the anode by short-circuiting the base and the collector and to use the emitter as the cathode.

Figure 3:
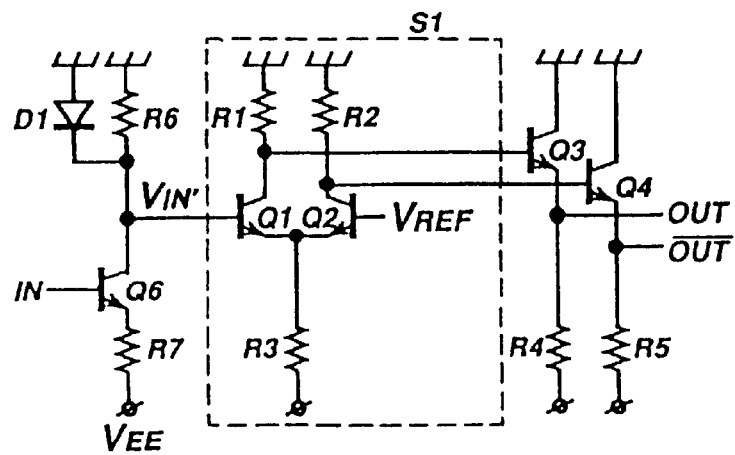
FIG. 3 is a circuit diagram of a semiconductor integrated circuit according to a second embodiment of the invention.
Figure 4:
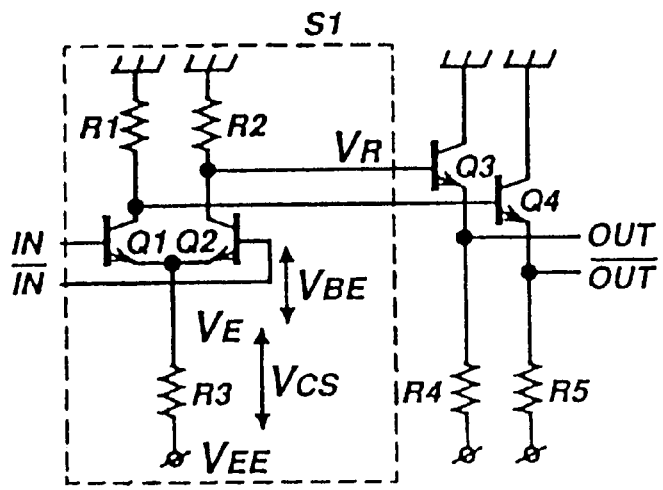
FIG. 4 is a circuit diagram of a conventional differential ECL circuit.
Figure 5:
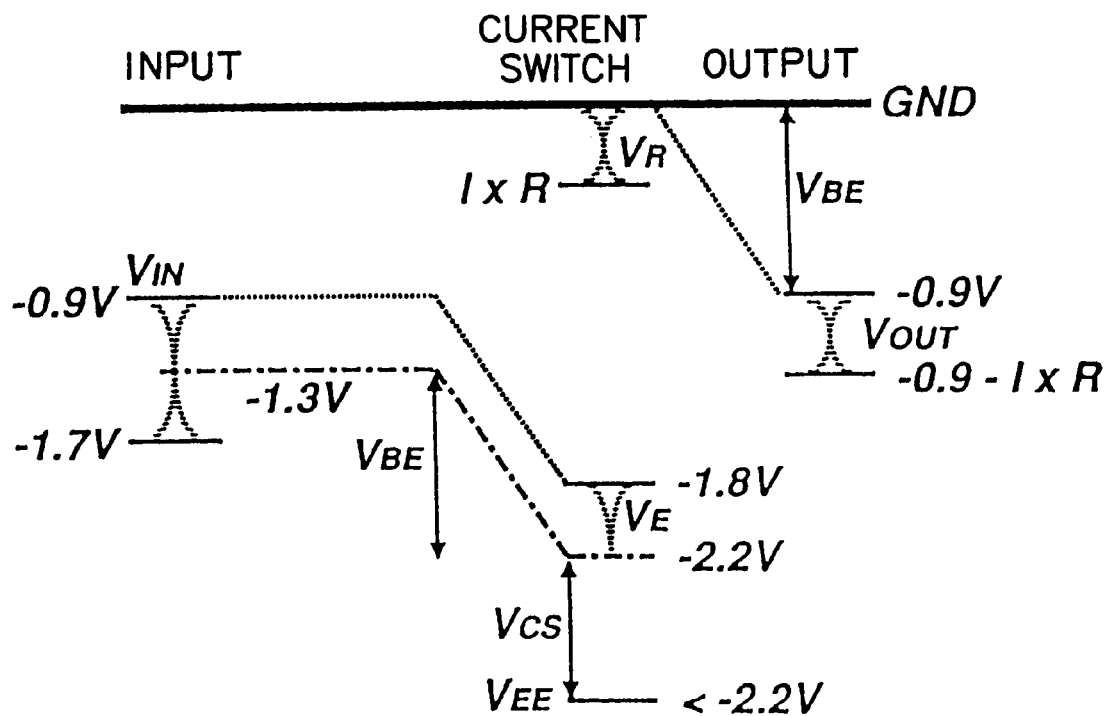
FIG. 5 is an explanatory diagram schematically showing potentials at internal nodes in the differential ECL circuit when the base-emitter voltage $V_{BE}$ of npn bipolar transistors is 0.9 V, and the reference potential GND is 0 V.

FIG. 3 is a circuit diagram of another semiconductor integrated circuit taken as a second embodiment of the invention.

The semiconductor integrated circuit according to the second embodiment additionally uses a circuit located in an input-side of the single-end ECL circuit to shift the potential level of the input signal introduced to the current switch toward high potentials. The additional circuit has the construction explained below. A first reference potential GND, which is typically the ground potential, is supplied to the anode of a diode D1 and to one end of a resistor R6. The cathode of the diode D1 and the other end of the resistor R6 are commonly connected to the collector of the npn bipolar transistor Q6. The bipolar transistor Q6 is supplied with one of input signals, IN, through the base, and its emitter is connected to one end of a resistor R7. The other end of the resistor R7 is supplied with the power source potential $V_{EE}$. Thus, $V_{IN}'$, as the input signal to the single end ECL circuit, is taken out from the connection node of the diode D1 and the resistor R6 in the additional circuit with the collector of the npn bipolar transistor Q6.

The part of the single-end ECL circuit has the same arrangement as that of a typical single-end ECL circuit. The resistors R1, R2 are supplied at their first ends with the reference potential GND, which is typically the ground potential. Connected to the other ends of the resistors R1 and R2 are collectors of npn bipolar transistors Q1 and Q2. The input signal $V_{IN}'$ taken out from the additional circuit is introduced to the base of Q1 of these two npn bipolar transistors Q1, Q2. On the other and, a second reference potential $V_{REF}$ is applied to the base of the other npn bipolar transistor Q2. Emitters of the npn bipolar transistors Q1, Q2 are connected together and commonly connected to one end of the resistor R3. The other end of the resistor R3 is supplied with the power source potential $V_{EE}$. These elements form the current switch S1, and output from the current switch S1 is used as input to the emitter follower.

That is, bases of npn bipolar transistors Q3, Q4 whose collectors are supplied with the reference potential GND are connected to the connection node of the resistor R1 with the collector of the npn bipolar transistor Q1 and the connection node of the resistor R2 with the collector of the npn bipolar transistor Q2. Emitters of the npn bipolar transistors Q3, Q4 are connected to given ends of resistors R4, R5 whose other ends are supplied with the power source potential $V_{EE}$. Output signals OUT and /OUT of the differential ECL circuit are taken out from connection nodes of the npn bipolar transistors Q3, Q4 with given ends of the resistors R4, R5.

Comparing the semiconductor integrated circuit according to the second embodiment with that of the first embodiment, only difference is that the second reference potential $V_{REF}=-0.45$ V, in lieu of input signal $V_{IN}'$, is introduced to the base of the npn bipolar transistor Q2 forming the current switch S1, and its essential behaviors are identical to those of the semiconductor integrated circuit according to the first embodiment. Therefore, also the semiconductor integrated circuit according to the second embodiment can realize an ECL circuit that can maintain stable operations.

In short, the semiconductor integrated circuit according to the invention promises an ECL circuit stably operative with an ECL signal of a standard potential level and operative with a low voltage power source. Therefore, the invention can reduce the power consumption of ECL circuits advantageous for high-speed operations, and makes it possible to use a single electric power source for generating both the power source voltage $V_{EE}$ and the terminal voltage $V_{TT}$ (=−2 V) which required different power sources in conventional circuits.

What is claimed is:

1. A semiconductor integrated circuit comprising:

a first resistor supplied with a first reference potential at one end thereof;

a first diode having an anode supplied with said first reference potential and a cathode connected commonly with the other end of said first resistor;

a first npn bipolar transistor having a collector connected to the other end of said first resistor and the cathode of said first diode which are commonly connected, and having a base supplied with a first input signal;

a second resistor having one end connected to the emitter of said first npn bipolar transistor and the other end supplied with a second reference potential;

a third resistor having one end supplied with said first reference potential;

a second diode having an anode supplied with said first reference potential and a cathode connected commonly with the other end of said third resistor;

a second npn bipolar transistor having a collector connected to the other end of said third resistor and the cathode of said second diode which are commonly connected, and having a base supplied with a second input signal;

a fourth resistor having one end connected to the emitter of said second npn bipolar transistor and the other end supplied with said second reference potential; and a differential ECL circuit supplied with a first differential input signal and a second differential input signal, said first differential input signal being a potential signal appearing at a first connection node where the other end of said first resistor and the cathode of said first diode are connected to the collector of said first npn bipolar transistor, and said second differential input signal being a potential signal appearing at a second connection node where the other end of said third resistor and the cathode of said second diode are connected to the collector of said second npn bipolar transistor.

2. A semiconductor integrated circuit comprising:

a first resistor supplied with a first reference potential at one end thereof;

a first diode having an anode supplied with said first reference potential and a cathode connected commonly with the other end of said first resistor;

a first npn bipolar transistor having a collector connected to the other end of said first resistor and the cathode of said first diode which are commonly connected, and having a base supplied with a first input signal;

a second resistor having one end connected directly to the emitter of said first npn bipolar transistor and the other end supplied with a second reference potential; and a single-end ECL circuit supplied with a input signal which is a potential signal appearing at a first connection node where the other end of said first resistor and the cathode of said first diode are connected to the collector of said first npn bipolar transistor, the input signal responsive to the first input signal and the single-end ECL circuit provided with a third reference potential at a second node to which the input signal is compared.

3. A semiconductor integrated circuit comprising:

a first resistor supplied with a first reference potential at one end thereof;

a first diode having an anode supplied with said first reference potential and a cathode connected commonly with the other end of said first resistor;

a first npn bipolar transistor having a collector connected to the other end of said first resistor and the cathode of said first diode which are commonly connected, and having a base supplied with a first input signal;

a second resistor having one end connected to the emitter of said first npn bipolar transistor and the other end supplied with a second reference potential;

a third resistor having one end supplied with said first reference potential;

a second diode having an anode supplied with said first reference potential and a cathode connected commonly with the other end of said third resistor;

a second npn bipolar transistor having a collector connected to the other end of said third resistor and the cathode of said second diode which are commonly connected, and having a base supplied with a second input signal;

a fourth resistor having one end connected to the emitter of said second npn bipolar transistor and the other end supplied with said second reference potential;

a fifth resistor having one end supplied with said first reference potential;

a third npn bipolar transistor having a collector connected to the other end of said fifth resistor, and having a base supplied with a potential signal appearing at a first connection node where the other end of said first resistor and the cathode of said first diode are connected to the collector of said first npn bipolar transistor;

a sixth resistor having one end supplied with said first reference potential;

a fourth npn bipolar transistor having a collector connected to the other end of said sixth resistor, and having a base supplied with a potential signal appearing at a second connection node where the other end of said third resistor and the cathode of said second diode are connected to the collector of said second npn bipolar transistor, an emitter of said fourth npn bipolar transistor being connected commonly with an emitter of said third npn bipolar transistor;

a seventh resistor having one end connected to the emitters of said third and fourth npn bipolar transistors which are commonly connected, and having the other end supplied with said second reference potential;

a fifth npn bipolar transistor having a collector supplied with said first reference potential, and a base supplied with a potential signal appearing at a third connection node where the other end of said fifth resistor is connected to the collector of said third npn bipolar transistor;

an eighth resistor having one end connected to the emitter of said fifth npn bipolar transistor and the other end supplied with said second reference potential;

a sixth npn bipolar transistor having a collector supplied with said first reference potential and a base supplied with a potential signal appearing at a fourth connection node where the other end of said sixth resistor is connected to the collector of said fourth npn bipolar transistor; and a ninth resistor having one end connected to the emitter of said sixth npn bipolar transistor and the other end supplied with said second reference potential, wherein a potential signal appearing at a fifth connection node where the emitter of said fifth npn bipolar transistor is connected to said one end of the eighth resistor is used as a first differential output, and a potential signal appearing at a sixth connection node where the emitter of said sixth npn bipolar transistor is connected to said one end of the ninth resistor is used as a second differential output.

4. A semiconductor integrated circuit comprising:

a first resistor supplied with a first reference potential at one end thereof;

a first diode having an anode supplied with said first reference potential and a cathode connected commonly with the other end of said first resistor;

a first npn bipolar transistor having a collector connected to the other end of said first resistor and the cathode of said first diode which are commonly connected, and having a base supplied with a first input signal;

a second resistor having one end connected directly to the emitter of said first npn bipolar transistor and the other end supplied with a second reference potential;

a third resistor having one end supplied with said first reference potential;

a second npn bipolar transistor having a collector connected to the other end of said third resistor, and a base supplied with an input potential signal responsive to the first input signal appearing at a first connection node where the other end of said first resistor and the cathode of said first diode are connected to the collector of said first npn bipolar transistor;

a fourth resistor supplied with said first reference potential at one end thereof;

a third npn bipolar transistor having a collector connected to the other end of said fourth resistor, and having a base supplied with a third reference potential, an emitter of said third npn bipolar transistor being connected commonly with an emitter of said second npn bipolar transistor;

a fifth resistor having one end connected to the emitter of said second npn bipolar transistor and the emitter of said third npn bipolar transistor which are commonly connected, and having the other end supplied with said second reference potential;

a fourth npn bipolar transistor having a collector supplied with said first reference potential, and having a base supplied with a potential signal appearing at a second connection node where the other end of said third resistor is connected to the collector of said second npn bipolar transistor;

a sixth resistor having one end connected to the emitter of said fourth npn bipolar transistor and the other end supplied with said second reference potential;

a fifth npn bipolar transistor having a collector supplied with said first reference potential, and having a base supplied with a potential signal appearing at a third connection node where the other end of aid fourth resistor is connected to the collector of said third npn bipolar transistor; and a seventh resistor having one end connected to the emitter of said fifth npn bipolar transistor, and the other end supplied with said second reference potential, wherein a potential signal appearing at a fourth connection node where the emitter of said fourth npn bipolar transistor is connected to said one end of the sixth resistor is used as a first differential output, and a potential signal appearing at a fifth connection node where the emitter of said fifth npn bipolar transistor is connected to said one end of the seventh resistor is used as a second differential output, the first and second differential output responsive to the input potential signal and the third reference potential.

5. A semiconductor integrated circuit comprising:

a first resistor supplied with a first reference potential at one end thereof;

a first npn bipolar transistor having a collector connected to the other end of said first resistor, and having a base supplied with a first input signal;

a second resistor having one end connected to the emitter of said first npn bipolar transistor, and the other end supplied with second reference potential;

a third resistor supplied with said first reference potential at one end thereof;

a second npn bipolar transistor having a collector connected to the other end of said third resistor, and having a base supplied with a second input signal;

a fourth resistor having one end connected to the emitter of said second npn bipolar transistor; and the other end supplied with said second reference potential, the first resistor, the first npn bipolar transistor and the second resistor forming a first portion of an input stage and the third resistor, the second npn bipolar transistor and the fourth resistor forming a second portion of an input stage; and a differential ECL circuit supplied with a first and second differential input signals, said first differential input signal being a potential signal appearing at a first connection node where the other end of said first resistor is connected to the collector of said first npn bipolar transistor, and said second differential input signal being a potential signal appearing at a second connection node where the other end of said first resistor is connected to the collector of said second npn bipolar transistor, the first and second portions of the input stage shifting respective potentials of the first input signal and the second input signal to provide stable operation of the differential ECL circuit when the second reference potential is within a base to emitter voltage drop across the first or second npn transistor of the average of the first and second input signals.

6. The semiconductor integrated circuit of claim 5, wherein the second reference potential is approximately two volts lower than the first reference potential.

7. A semiconductor integrated circuit comprising:

a first resistor supplied with a first reference potential at one end thereof;

a first npn bipolar transistor having a collector connected to the other end of said first resistor, and a base supplied with a first input signal;

a second resistor having one end connected to the emitter of said first npn bipolar transistor, and the other end supplied with a second reference potential;

a third resistor having one end supplied with said first reference potential at one end thereof;

a second npn bipolar transistor having a collector connected to the other end of said third resistor, and a base supplied with a second input signal;

a fourth resistor having one end connected to the emitter of said second npn bipolar transistor, and the other end supplied with said second reference potential, the first resistor, the first npn bipolar transistor and the second resistor forming a first portion of an input stage and the third resistor, the second npn bipolar transistor and the fourth resistor forming a second portion of an input stage;

a third npn bipolar transistor having a collector connected to the other end of said fifth resistor, and a base supplied with a potential signal appearing at a first connection node where the other end of said first resistor is connected to the collector of said first npn bipolar transistor;

a sixth resistor supplied with said first reference potential at one end thereof;

a fourth npn bipolar transistor having a collector connected to the other end of said sixth resistor, and having a base supplied with a potential signal appearing at a second connection node where the other end of said third resistor is connected to the collector of said second npn bipolar transistor, an emitter of said fourth npn bipolar transistor being connected commonly with an emitter of said third npn bipolar transistor, the third and fourth bipolar transistors forming a part of a differential ECL circuit and the first and second portions of the input stage shifting respective potentials of the first input signal and the second input signal to provide stable operation of the differential ECL circuit when the second reference potential is within a base to emitter voltage drop across the first or second npn transistor of the average of the first and second input signals;

a seventh resistor having one end connected to the emitters of said third and fourth npn bipolar transistors which are commonly connected, and having the other end supplied with said second reference potential;

a fifth npn bipolar transistor having a collector supplied with said first reference potential, and a base supplied with a potential signal appearing at a third connection node where the other end of said fifth resistor is connected to the collector of said third npn bipolar transistor;

an eighth resistor having one end connected to the emitter of said fifth npn bipolar transistor, and the other end supplied with said second reference potential;

a sixth npn bipolar transistor having a collector supplied with said first reference potential, and having a base supplied with a potential signal appearing at a fourth connection node where the other end of said sixth resistor is connected to the collector of said fourth npn bipolar transistor; and a ninth resistor having one end connected to the emitter of said sixth npn bipolar transistor and the other end supplied with said second reference potential, wherein a first differential output is a potential signal appearing at a fifth connection node where the emitter of said fifth npn bipolar transistor is connected to said one end of the eighth resistor, and a second differential output is a potential signal appearing at a sixth connection node where the emitter of said sixth npn bipolar transistor is connected to said one end of the ninth resistor.

8. The semiconductor integrated circuit of claim 7, wherein the second reference potential is approximately two volts lower than the first reference potential.

9. A semiconductor integrated circuit comprising:

a first resistor supplied with a first reference potential at one end thereof;

a first npn bipolar transistor having a collector connected to the other end of said first resistor, and a base supplied with a first input signal;

a second resistor having one end connected directly to the emitter of said first npn bipolar transistor, and the other end supplied with a second reference potential;

a third resistor supplied with said first reference potential at one end thereof;

a second npn bipolar transistor having a collector connected to the other end of said third resistor, and a base supplied with an input potential signal responsive to the first input signal appearing at a first connection node where the other end of said first resistor is connected to the collector of said first npn bipolar transistor;

a fourth resistor supplied with said first reference potential at one end thereof;

a third npn bipolar transistor having a collector connected to the other end of said fourth resistor, and a base supplied with a third reference potential, an emitter of said third npn bipolar transistor being connected commonly with an emitter of said second npn bipolar transistor;

a fifth resistor having one end connected to the emitters of said second and third npn bipolar transistors which are commonly connected, and having the other end supplied with said second reference potential;

a fourth npn bipolar transistor having a collector supplied with said first reference potential, and a base supplied with a potential signal appearing at a second connection node where the other end of said third resistor is connected to the collector of said second npn bipolar transistor;

a sixth resistor having one end connected to the emitter of said fourth npn bipolar transistor, and the other end supplied with said second reference potential;

a fifth npn bipolar transistor having a collector supplied with said first reference potential, and a base supplied with a potential signal appearing at a third connection node where the other end of aid fourth resistor is connected to the collector of said third npn bipolar transistor; and a seventh resistor having one end connected to the emitter of said fifth npn bipolar transistor, and the other end supplied with said second reference potential, wherein a first difference output is a potential signal appearing at a fourth connection node where the emitter of said fourth npn bipolar transistor is connected to said one end of the sixth resistor, and a second differential output is a potential signal appearing at a connection node where the emitter of said fifth npn bipolar transistor is connected to one end of the sixth resistor, the first and second differential output responsive to the input potential signal and the third reference potential.

* * * * *